US012457844B2

(12) United States Patent
Lee et al.

(10) Patent No.: US 12,457,844 B2
(45) Date of Patent: Oct. 28, 2025

(54) DISPLAY DEVICE AND METHOD OF MANUFACTURING THE SAME

(71) Applicant: Samsung Display Co., Ltd., Yongin-si (KR)

(72) Inventors: Joongu Lee, Yongin-si (KR); Hyejin Gwark, Yongin-si (KR); Arong Kim, Yongin-si (KR); Jaeik Kim, Yongin-si (KR); Jungsun Park, Yongin-si (KR); Heemin Park, Yongin-si (KR); Yeonhwa Lee, Yongin-si (KR); Kyuhwan Hwang, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 664 days.

(21) Appl. No.: 17/837,769

(22) Filed: Jun. 10, 2022

(65) Prior Publication Data

US 2023/0103050 A1 Mar. 30, 2023

(30) Foreign Application Priority Data

Sep. 30, 2021 (KR) .......................... 10-2021-0130308

(51) Int. Cl.
*H10K 50/11* (2023.01)
*H10K 71/00* (2023.01)

(52) U.S. Cl.
CPC ............. *H10K 50/11* (2023.02); *H10K 71/00* (2023.02)

(58) Field of Classification Search
CPC .................................................... H01K 50/11
See application file for complete search history.

(56) References Cited

U.S. PATENT DOCUMENTS

| 10,115,776 | B2 * | 10/2018 | Park ....................... H10K 71/00 |
| 10,770,526 | B2 * | 9/2020 | Kim ..................... H10K 59/122 |
| 10,935,492 | B2 | 3/2021 | Ghosh et al. |
| 11,217,641 | B2 | 1/2022 | Murai et al. |
| 11,367,761 | B2 | 6/2022 | Kim et al. |
| 11,985,841 | B2 * | 5/2024 | Helander ......... H10K 59/80522 |

(Continued)

FOREIGN PATENT DOCUMENTS

| KR | 10-1272498 B1 | 6/2013 |
| KR | 10-2019-0090343 | 8/2019 |

(Continued)

*Primary Examiner* — William A Harriston
(74) *Attorney, Agent, or Firm* — Womble Bond Dickinson (US) LLP

(57) ABSTRACT

A display device including a transmission area having improved transmittance and a method of manufacturing the same are provided. The display device includes: a substrate including a display area and a peripheral area outside the display area, the display area having a transmission area and a pixel area; a display element corresponding to the pixel area and including a pixel electrode, an intermediate layer on the pixel electrode, and a counter electrode on the intermediate layer; a photoluminescent layer corresponding to the transmission area and including a photoluminescent material; and an auxiliary layer on the photoluminescent layer, wherein the counter electrode includes a first material, the auxiliary layer includes a second material, and the first material is higher in surface energy than the second material, at room temperature.

20 Claims, 11 Drawing Sheets

(56) References Cited

U.S. PATENT DOCUMENTS

| | | | | |
|---|---|---|---|---|
| 2005/0200273 A1* | 9/2005 | Nozawa | H10K 50/82 | 313/506 |
| 2006/0022587 A1* | 2/2006 | Jeong | H10K 59/122 | 313/504 |
| 2006/0284549 A1* | 12/2006 | Lee | H10K 59/12 | 313/503 |
| 2009/0021664 A1* | 1/2009 | Yamazaki | H10D 30/67 | 349/47 |
| 2009/0051278 A1* | 2/2009 | Saneto | H10K 59/877 | 313/504 |
| 2012/0248973 A1* | 10/2012 | Ito | H10K 85/654 | 252/301.16 |
| 2012/0319089 A1* | 12/2012 | Shin | H10K 71/00 | 257/E51.024 |
| 2015/0234215 A1* | 8/2015 | Kim | G02F 1/1341 | 349/110 |
| 2016/0099263 A1* | 4/2016 | Kang | H10D 86/411 | 257/72 |
| 2016/0111688 A1* | 4/2016 | Lee | H10K 71/00 | 438/34 |
| 2017/0137667 A1* | 5/2017 | Sonoda | C08G 73/101 | |
| 2020/0357871 A1* | 11/2020 | Chung | H10K 59/879 | |
| 2020/0365674 A1 | 11/2020 | Jeon et al. | | |
| 2020/0373364 A1* | 11/2020 | Yoon | H10K 59/122 | |
| 2021/0054149 A1* | 2/2021 | Kim | C09D 183/12 | |
| 2021/0305331 A1* | 9/2021 | Yu | H10K 59/38 | |
| 2021/0376300 A1* | 12/2021 | Moon | H10K 50/11 | |
| 2021/0408167 A1* | 12/2021 | Kim | H10K 59/88 | |

FOREIGN PATENT DOCUMENTS

| | | |
|---|---|---|
| KR | 10-2020-0039866 A | 4/2020 |
| KR | 10-2020-0125419 | 11/2020 |
| KR | 10-2020-0131397 | 11/2020 |
| KR | 10-2020-0132997 A | 11/2020 |

* cited by examiner

DISPLAY DEVICE AND METHOD OF MANUFACTURING THE SAME

CROSS-REFERENCE TO RELATED APPLICATION

This application claims priority to and the benefit of Korean Patent Application No. 10-2021-0130308, filed on Sep. 30, 2021, in the Korean Intellectual Property Office, the entire content of which is hereby incorporated by reference.

BACKGROUND

1. Field

One or more embodiments relate to a display device and a method of manufacturing the same, and for example, to a display device having a transmission area and a method of manufacturing the same.

2. Description of the Related Art

In recent years, the usage of display devices has diversified. In some embodiments, display devices have been made thinner and the weight thereof has been lowered, and thus, the range of the use thereof is increasing.

As an example, research to implement transmittance or transparency in a display device is ongoing. For example, there is an attempt to form a transparent display device by making a thin-film transistor or a display panel inside the display device transparent.

In order to implement a transparent display device, it is useful or desirable to optimize or improve one or more suitable variables such as composition, arrangement, and thickness of one or more suitable materials such as of a substrate, an electrode, an insulating film, and/or a capping film. For example, in the case of an organic light-emitting display device, a plurality of conductive layers and insulating layers including different materials are stacked, and accordingly, optical properties are deteriorated, and thus it may not be easy to obtain expected transmittance or transparency.

SUMMARY

One or more aspects of embodiments are directed towards a display device including a transmission area having improved transmittance and/or a method of manufacturing the display device. However, these are example aspects, and the scope of the present disclosure is not limited thereto.

Additional aspects will be set forth in part in the description which follows and, in part, will be apparent from the description, or may be learned by practice of the presented embodiments of the disclosure.

According to an embodiment, a display device includes a substrate including a display area and a peripheral area outside the display area, the display area having a transmission area and a pixel area, a display element corresponding to the pixel area and including a pixel electrode, an intermediate layer on the pixel electrode, and a counter electrode on the intermediate layer, a photoluminescent layer corresponding to the transmission area and including (e.g., being) a photoluminescent material, and an auxiliary layer arranged on the photoluminescent layer, wherein the counter electrode includes (e.g., is) a first material, the auxiliary layer includes (e.g., is) a second material, and the first material is higher in surface energy than the second material at room temperature.

In an embodiment, the first material may include (e.g., be) silver (Ag), aluminum (Al), magnesium (Mg), or an alloy thereof.

In an embodiment, the second material may contain at least 30 at % of fluorine.

In an embodiment, the second material may include (e.g., be) a fluorine-containing silane compound, a fluorine-based polymer compound, a fluorine-based monomolecular organic compound, and combinations thereof.

In an embodiment, the auxiliary layer may be arranged to overlap the photoluminescent layer.

In an embodiment, the photoluminescent material may have more conjugated bonding structures than the second material.

In an embodiment, the photoluminescent material may be an aryl amine derivative, an oxadiazole derivative, a triazole derivative, a benzimidazole derivative, an anthracene derivative, a carbazole derivative, or a mixture thereof.

In an embodiment, the intermediate layer may include an emission layer corresponding to the pixel electrode, and a common layer between the pixel electrode and the counter electrode, wherein the photoluminescent layer is arranged on the common layer.

In an embodiment, the photoluminescent layer may include (e.g., be) the same material as the common layer or the emission layer.

In an embodiment, the display device may further include an organic laminate structure arranged under the auxiliary layer and including (e.g., being) the photoluminescent material, wherein the organic laminate structure has a first portion corresponding to the transmission area and a second portion around (e.g., surrounding) a periphery of the first portion, wherein the first portion is thicker than the second portion.

In an embodiment, the photoluminescent layer may have a thickness of about 10 Å to about 1000 Å.

In an embodiment, the display device may further include a capping layer arranged on the counter electrode to correspond to the display area.

In an embodiment, the capping layer may have an opening corresponding to the transmission area.

In an embodiment, the counter electrode may have an opening corresponding to the transmission area.

In an embodiment, the display device may further include a plurality of fine particles arranged on the auxiliary layer and including (e.g., being) the first material.

According to another embodiment, a method of manufacturing a display device includes providing a substrate, the substrate including a display area and a peripheral area outside the display area, the display area having a transmission area and a pixel area, forming a pixel electrode to correspond to the pixel area, forming an intermediate layer on the pixel electrode to correspond to the pixel area and the transmission area, sequentially forming a photoluminescent layer and an auxiliary layer to correspond to the transmission area, and depositing a first material on the intermediate layer and the auxiliary layer to correspond to the pixel area and the transmission area, wherein the auxiliary layer includes (e.g., is) a second material, wherein the first material is higher in surface energy than the second material at room temperature.

In an embodiment, the sequentially forming of the photoluminescent layer and the auxiliary layer may include forming the photoluminescent layer and the auxiliary layer utilizing a fine metal mask, irradiating the photoluminescent layer with light, and correcting a position of the fine metal mask based on an emission pattern of the photoluminescent layer.

In an embodiment, the photoluminescent layer may include (e.g., be) a photoluminescent material, and the photoluminescent material may have more conjugated bonding structures than the second material.

In an embodiment, the depositing of the first material may include forming a counter electrode on the intermediate layer to correspond to the pixel area, and forming a plurality of fine particles on the auxiliary layer to correspond to the transmission area.

BRIEF DESCRIPTION OF THE DRAWINGS

The above and other aspects and features of embodiments of the disclosure will be more apparent from the following description taken in conjunction with the accompanying drawings, in which.

DETAILED DESCRIPTION

Figure 1:
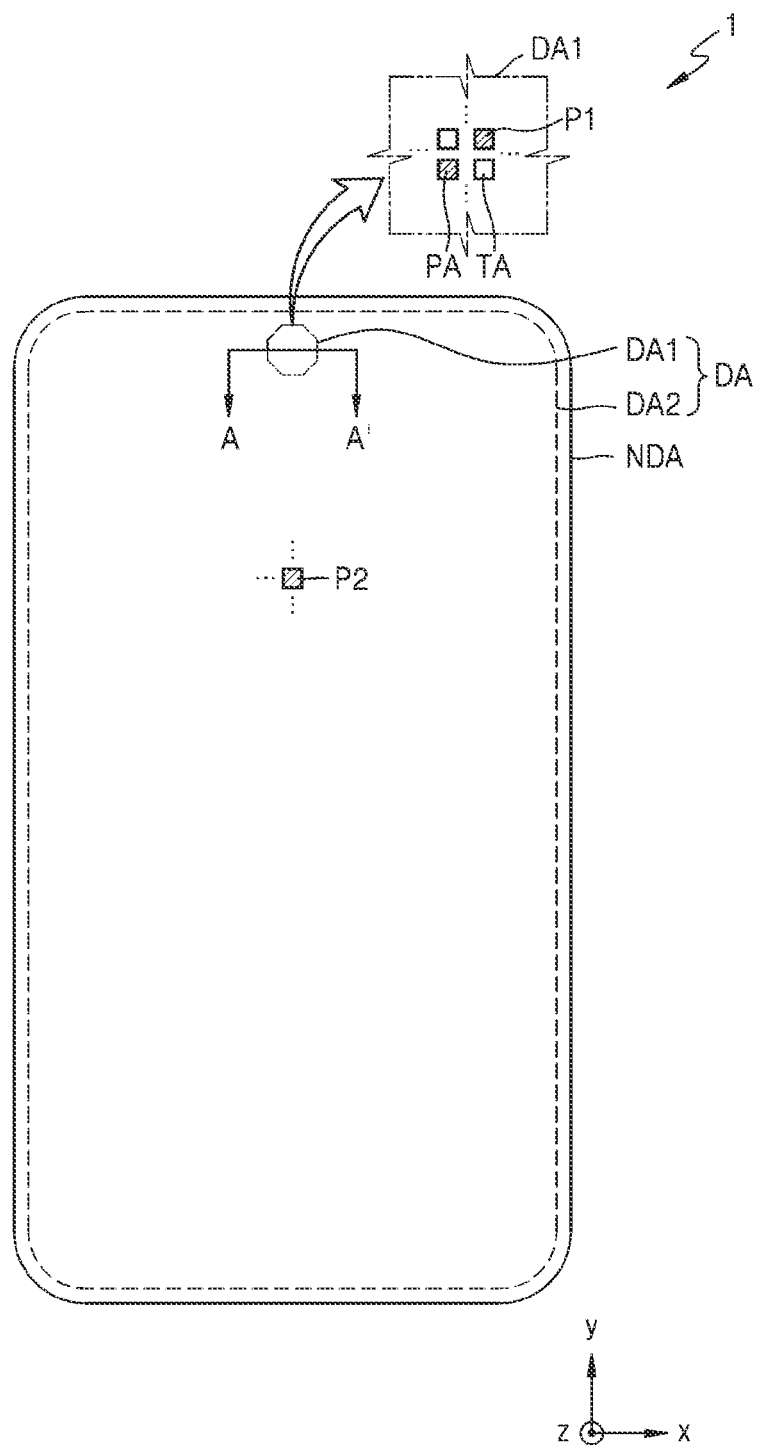
FIG. 1 is a plan view schematically illustrating a display device according to an embodiment.

Reference will now be made in more detail to embodiments, examples of which are illustrated in the accompanying drawings, wherein like reference numerals refer to like elements throughout, and duplicative descriptions thereof may not be provided. In this regard, the present embodiments may have different forms and should not be construed as being limited to the descriptions set forth herein. Accordingly, the embodiments are merely described, by referring to the drawings, to explain aspects of the present description. As used herein, the term "and/or" includes any and all combinations of one or more of the associated listed items. Throughout the disclosure, the expressions "at least one of a, b or c" and "at least one of a, b, and c" indicates only a, only b, only c, both (e.g., simultaneously) a and b, both (e.g., simultaneously) a and c, both (e.g., simultaneously) b and c, all of a, b, and c, or variations thereof. As used herein, the use of the term "may," when describing embodiments of the present disclosure, refers to "one or more embodiments of the present disclosure."

Because the present disclosure can apply one or more suitable modifications and can have one or more suitable embodiments, specific embodiments are illustrated in the drawings and described in more detail in the detailed description. Aspects and features of the present disclosure, and methods of achieving them, will become apparent with reference to the embodiments described in more detail in conjunction with the drawings. However, the present disclosure is not limited to the embodiments disclosed, and may be implemented in one or more suitable forms.

Hereinafter, embodiments of the present disclosure will be described in more detail with reference to the accompanying drawings. When describing the present disclosure with reference to the drawings, the same or corresponding components are given the same reference numerals, and overlapping or redundant descriptions thereof may not be provided.

As used herein, the terms such as first, second, etc. are used for the purpose of distinguishing one component from another without limiting meaning.

As used herein, the singular forms include the plural forms as well, unless the context clearly indicates otherwise.

As used herein, the terms such as comprise, include, have, or the like refers to that the features or components described in the specification are present, and one or more other features or components may be included.

As used herein, when one or more suitable components such as layers, films, regions, plates, etc. are "on" other components, this includes not only a case where they are "directly on" other components, but also a case where one or more intervening components is therebetween.

As used herein, the case where films, regions, components are connected includes a case where the films, regions, components are directly connected and/or a case where the films, regions, components are indirectly connected by one or more intervening film, region, component therebetween. For example, as used herein, the case where films, regions, components are electrically connected includes a case where the films, regions, components are directly electrically connected and/or a case where the films, regions, components are indirectly electrically connected by one or more intervening film, region, component therebetween.

As used herein, "A and/or B" refers to A, B, or A and B. In some embodiments, "at least one of A and B" refers to A, B, or A and B.

As used herein, the x-axis, y-axis, and z-axis are not limited to three axes on a Cartesian coordinate system, and may be interpreted in a broad sense including them. For example, the x-axis, y-axis, and z-axis may be orthogonal to each other, but may indicate different directions that are not orthogonal to each other.

As used herein, example process sequences may be performed different from the described sequence. For example, two processes described in succession may be performed substantially simultaneously or concurrently, or may be performed in an order opposite to the order described.

For convenience of description, in the drawings, the sizes of components may be exaggerated or reduced. For example, because the size and thickness of each component shown in the drawings may be exaggerated or reduced for convenience of description, the present disclosure is not necessarily limited to descriptions with reference to the drawings.

FIG. 1 is a plan view schematically illustrating a display device 1 according to an embodiment.

Referring to FIG. 1, a display device 1 is a device for displaying a moving image and/or a still image, and may be used as a display screen of one or more suitable products such as televisions, notebook computers, monitors, billboards, and internet of things (IOTs) as well as portable electronic appliances such as mobile phones, smart phones, tablet personal computers, mobile communication terminals, electronic notebooks, e-books, portable multimedia players (PMPs), navigators, and ultra-mobile PCs (UMPCs). In some embodiments, the display device 1 according to an embodiment may be applied to wearable appliances such as smart watches, watch phones, glass displays, and head mounted displays (HMDs). In some embodiments, the display device 1 according to an embodiment may be applied to car dashboards, center information displays (CIDs) arranged in a car dashboard or car center fascia, room mirror displays replacing car room mirrors, and display screens arranged on the back surface of a front seat as entertainment for a rear seat of a car. For convenience of explanation, it is shown in FIG. 1 that the display device 1 according to an embodiment is used as a smartphone.

The display device 1 includes a display area DA and a peripheral area NDA outside the display area DA. The display area DA may include a first area DA1 defined as an auxiliary display area or a component area, and a second area DA2 defined as a main display area at least partially around (e.g., surrounding) the first area DA1. In some embodiments, the first area DA1 and the second area DA2 may display an image individually or together.

The peripheral area NDA may be a kind of non-display area in which display elements are not arranged. The display area DA may be entirely surrounded by the peripheral area NDA. In some embodiments, the peripheral area NDA may be around the display area DA.

FIG. 1 illustrates that one first area DA1 is located within the second area DA2. In another embodiment, the display device 1 may have two or more first areas DA1, and the shapes and sizes of the plurality of first areas DA1 may be different from each other. When viewed from a direction approximately normal (e.g., approximately perpendicular) to the upper surface of the display device 1, the first area DA1 may have one or more suitable shapes, such as polygons such as a square, a hexagon, and an octagon, circles, ellipses, stars, or diamonds. In some embodiments, although it is shown in FIG. 1 that the first area DA1 is arranged at the upper (+y direction) center of the display area DA having a rectangular shape with substantially rounded corners when viewed from a direction substantially normal (e.g., substantially perpendicular) to the upper surface of the display device 1, the present disclosure is not limited thereto. For example, the first area DA1 may be arranged on one side of the display area DA, for example, on the upper right side or upper left side of the display area DA.

The first area DA1 may include a pixel area PA and a transmission area TA. Each of the pixel area PA and the transmission area TA may be provided in plurality, and may be alternately arranged with each other (e.g., alternately arranged with each other in rows and/or alternately arranged with each other in columns). Pixels are arranged in the pixel area PA, but no pixels are arranged in the transmission area TA. The transmission area TA may be an area in which the arrangement of components constituting a display layer DSL (refer to FIG. 2) is minimized or reduced, and may allow light to be transmitted through a substrate 100.

A plurality of first pixels P1 are arranged in the pixel area PA of the first area DA1. Each of the first pixels P1 refers to a sub-pixel, and may be implemented by a display element such as an organic light-emitting diode (OLED). The first pixel P1 may be to emit, for example, red, green, blue, or white light.

The transmission area TA may be arranged to be around (e.g., to surround) and/or adjacent to the plurality of first pixels P1. In some embodiments, the transmission area TA may be alternately arranged with the plurality of first pixels P1.

Because the first area DA1 has the transmission area TA, the resolution of the first area DA1 may be lower than that of the second area DA2. For example, the resolution of the first area DA1 is about ½, ⅜, ⅓, ¼, ⅖, ⅛, ⅑, or 1/16 of the resolution of the second area DA2. For example, the resolution of the first area DA1 may be about 200 ppi or about 100 ppi, and the resolution of the second area DA2 may be about 400 ppi or more.

A plurality of second pixels P2 are arranged in the second area DA2. Each of the second pixels P2 refers to a sub-pixel, and may be implemented by a display element such as an organic light-emitting diode (OLED). The second pixel P2 may be to emit, for example, red, green, blue, or white light.

The display device 1 may provide an image through the first area DA1 and the second area DA2.

In some embodiments, in the first area DA1, as will be described later with reference to FIG. 2, an electronic component 20 (refer to FIG. 2) may be arranged under a display panel 10 to correspond to the first area DA1.

In the case of the display device according to an embodiment, when light is transmitted through the first area DA1, the light transmittance thereof may be about 10% or more, more 40% or more, 25% or more, 50% or more, 85% or more, or 90% or more.

Figure 2:
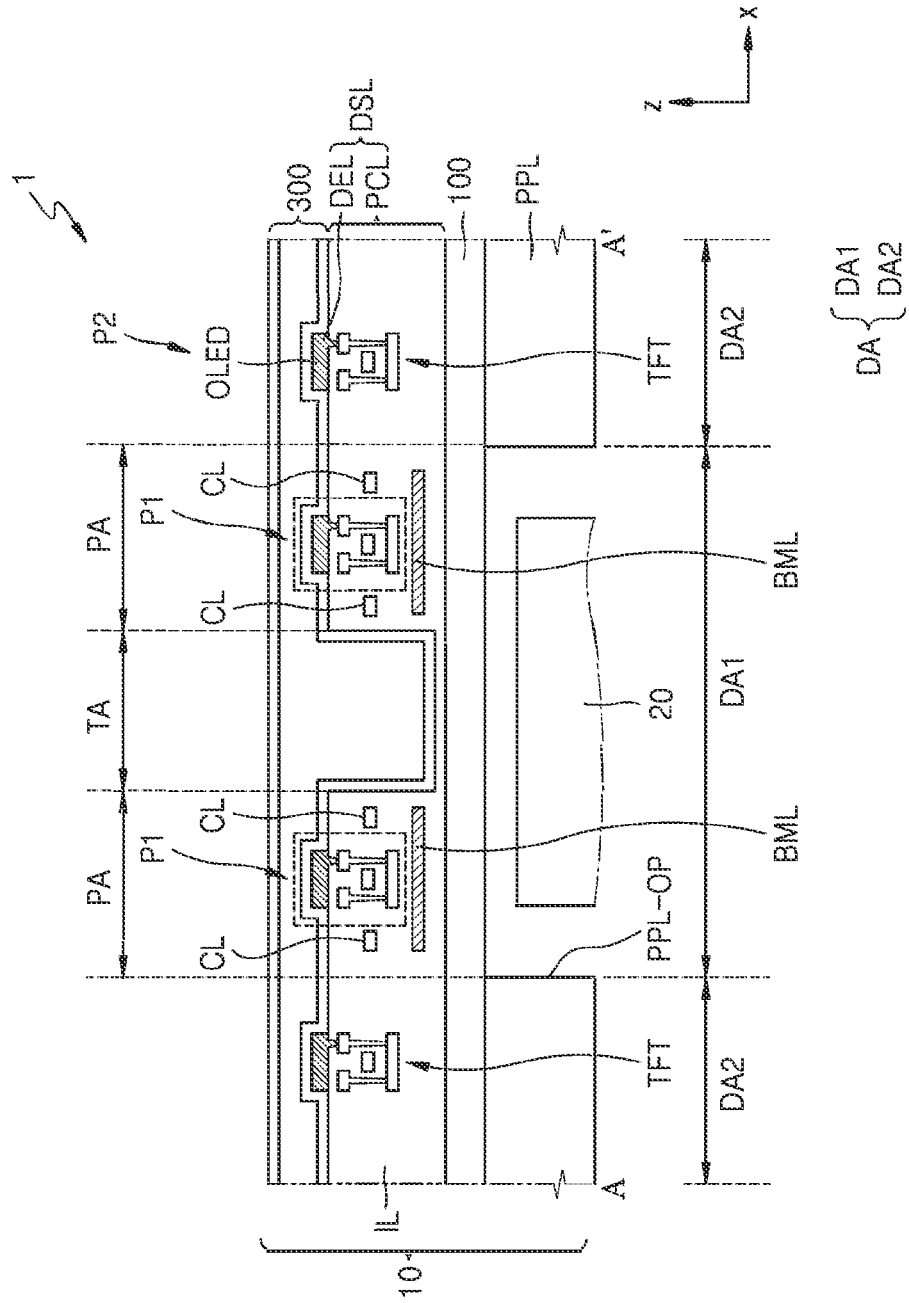
FIG. 2 is a cross-sectional view schematically illustrating a part of a display device according to an embodiment.

FIG. 2 is a cross-sectional view schematically illustrating a part of a display device according to an embodiment.

Referring to FIG. 2, the display device 1 may include a display panel 10 and a component 20 overlapping the display panel 10. A cover window for protecting the display panel 10 may be further provided on the display panel 10.

The display panel 10 may include a substrate 100, a display layer DSL, a thin-film encapsulation layer 300, and a panel protection layer PPL arranged under the substrate 100. A touch sensing layer and/or a polarization layer may be further provided on the thin-film encapsulation layer 300.

The substrate 100 may be made of an insulating material such as glass, quartz, and/or polymer resin. The substrate 100 may be a rigid substrate or a flexible substrate capable of bending, folding, rolling, and/or the like. In an embodiment, the substrate 100 has a multi-layer structure, and may include at least one organic layer and at least one inorganic layer.

The display layer DSL may include a pixel circuit layer PCL including a thin-film transistor TFT, a display element layer DEL including an organic light-emitting diode OLED as a display element, and an encapsulation member such as a thin-film encapsulation layer 300 or an encapsulation substrate. In some embodiments, the thin-film encapsulation layer 300 may be on (e.g., cover) the display layer DSL. Pixels P1 and P2 including a thin-film transistor TFT and an organic light-emitting diode OLED coupled (e.g., connected) thereto may be arranged in the display layer DSL corresponding to the display area DA.

A first pixel P1 including a thin-film transistor TFT and an organic light-emitting diode OLED coupled (e.g., connected) thereto may be arranged in the first area DA1. Although it is shown in FIG. 2 that one first pixel P1 is included in the pixel area PA, a plurality of first pixels P1 may also be included in each pixel area PA.

A transmission area TA in which a display element is not arranged may be provided between the pixel areas PA of the first area DA1. The transmission area TA may be an area through which light/signal emitted from the component 20 or light/signal incident to the component 20 is transmitted. At least a part of an inorganic insulating layer IL corresponding to the transmission area TA may be removed, and other parts thereof may be arranged on the transmission area TA. As such, the light transmittance of the transmission area TA may be improved by removing a part of the inorganic insulating layer IL corresponding to the transmission area TA.

The component 20 may be located to correspond to the first area DA1. The component 20 may be an electronic element using light and/or sound. For example, the component 20 may be a sensor that receives and utilizes light, such as an infrared sensor, a sensor that outputs and senses light and/or sound to measure a distance and/or recognizes a fingerprint, a small lamp that outputs light, a speaker that outputs a sound, or a camera including an image pickup device. In the case of an electronic element using light, light of one or more suitable wavelength bands such as visible light, infrared light, and ultraviolet light may also be used. For example, the component 20 may be a solar cell, a flash, an illuminance sensor, a proximity sensor, an iris sensor, or a camera. In order to minimize or reduce the limitation of the function of the component 20, the transmission area TA may be arranged in the first area DA1. Light output from the component 20 to the outside or light traveling toward the component 20 from the outside may be transmitted through the transmission area TA.

In an embodiment, a plurality of components 20 may be arranged in the first area DA1. In this case, the plurality of components 20 may have different functions from each other. For example, the plurality of components 20 may include at least two selected from a camera (image pickup device), a solar cell, a flash, a proximity sensor, an illuminance sensor, and an iris sensor.

In an embodiment, a bottom metal layer BML may be arranged in the first area DA1. The bottom metal layer BML may be arranged to correspond to each pixel area PA. The bottom metal layer BML may prevent, reduce, or block external light, for example, light emitted from the component 20 from reaching the first pixel P1. In some embodiments, the bottom metal layer BML may prevent or reduce the reflection and/or diffraction of light generated while external light passes between connection lines CL, thereby preventing or reducing the image distortion (for example, flare, haze, etc.) in the first area DA1.

A constant voltage or a signal is applied to the bottom metal layer BML to prevent or reduce damage to the pixel circuit due to electrostatic discharge. In another embodiment, the bottom metal layers BML arranged to correspond to different pixel areas PA may receive different voltages.

The thin-film encapsulation layer 300 may include at least one inorganic encapsulation layer and at least one organic encapsulation layer. The thin-film encapsulation layer 300 may also be arranged on the transmission area TA. In some embodiments, although it is described in the present embodiment that the thin-film encapsulation layer 300 is used as an encapsulation member for encapsulating the display element layer DEL, the present disclosure is not limited thereto. For example, as the encapsulation member for encapsulating the display element layer DEL, an encapsulation substrate coupled (e.g., attached) to the substrate 100 by a sealant or a frit may be used.

The panel protection layer PPL may be coupled (e.g., attached) to the bottom of the substrate 100 to support and protect the substrate 100. The panel protection layer PPL may have an opening PPL-OP corresponding to the first area DA1. The panel protection layer PPL may have the opening PPL-OP, thereby improving the light transmittance of the first area DA1. The panel protection layer PPL may include (e.g., be) polyethylene terephthalate and/or polyimide. In some embodiments, the area of the opening PPL-OP may be smaller than that of the first area DA1.

A cover window may be arranged on the display panel 10 to protect the display panel 10.

The display device 1 shown in FIG. 2 is a front-emission type or kind, or front-emission configured, display device in which a user located at a side of the display layer DSL with respect to the substrate 100 observes an image, but the display device 1 of the present disclosure is not limited thereto. For example, the display device 1 may be a back-emission type or back-emission configured display device in which an image is realized from the display layer DSL toward the substrate 100.

Figure 3:
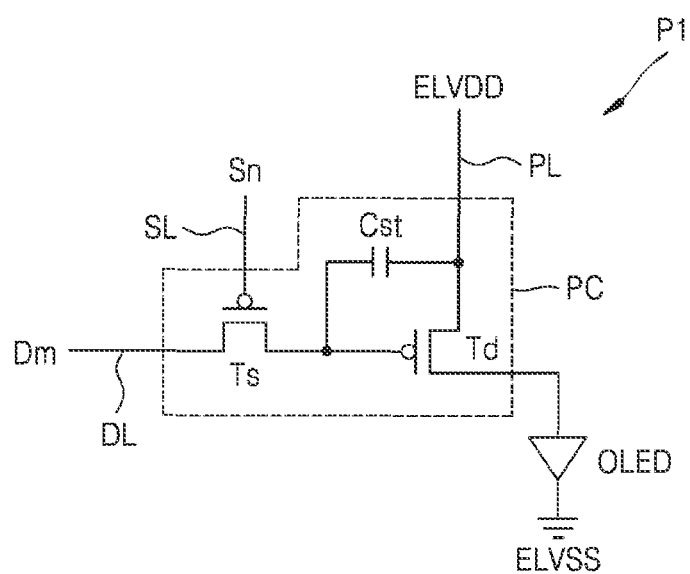
FIG. 3 is an equivalent circuit diagram of a pixel included in a display device according to an embodiment.

FIG. 3 is an equivalent circuit diagram of a pixel included in a display device according to an embodiment.

Referring to FIG. 3, the first pixel P1 includes a pixel circuit PC coupled (e.g., connected) to a driving voltage line PL, a scan line SL, and a data line DL, and an organic light-emitting diode OLED coupled (e.g., connected) to the pixel circuit PC.

The pixel circuit PC includes a driving thin-film transistor Td, a switching thin-film transistor Ts, and a storage capacitor Cst. The switching thin-film transistor Ts is coupled (e.g., connected) to the scan line SL and the data line DL, and is to transmit a data signal Dm input through the data line DL to the driving thin-film transistor Td in response to a scan signal Sn input through the scan line SL.

The storage capacitor Cst is coupled (e.g., connected) to the switching thin-film transistor Ts and the driving voltage line PL, and is to store a voltage corresponding to a difference between the voltage received from the switching thin-film transistor Ts and the first power voltage (for example, driving voltage, ELVDD) supplied to the driving voltage line PL.

The driving thin-film transistor Td is coupled (e.g., connected) to the driving voltage line PL and the storage capacitor Cst, and may control a driving current flowing from the driving voltage line PL toward the organic light-emitting diode OLED in response to a voltage value stored in the storage capacitor Cst. The organic light-emitting diode (OLED) may be to emit light having a set or predetermined luminance by a second power voltage (for example, a common voltage, ELVSS) and a driving current.

Although it is shown in FIG. 3 that the pixel circuit PC includes two thin-film transistors and one storage capacitor, the present disclosure is not limited thereto. In another embodiment, the pixel circuit PC may include seven thin-film transistors and one storage capacitor. In another embodiment, the pixel circuit PC may include two or more storage capacitors.

In an embodiment, the second pixel P2 may have the same pixel circuit structure as the first pixel P1, or may have a different pixel circuit structure from the first pixel P1. For example, the first pixel P1 may have a pixel circuit structure including two thin-film transistors and one storage capacitor, whereas the second pixel P2 may have a pixel circuit structure including seven thin-film transistors and one storage capacitor.

Figure 4:
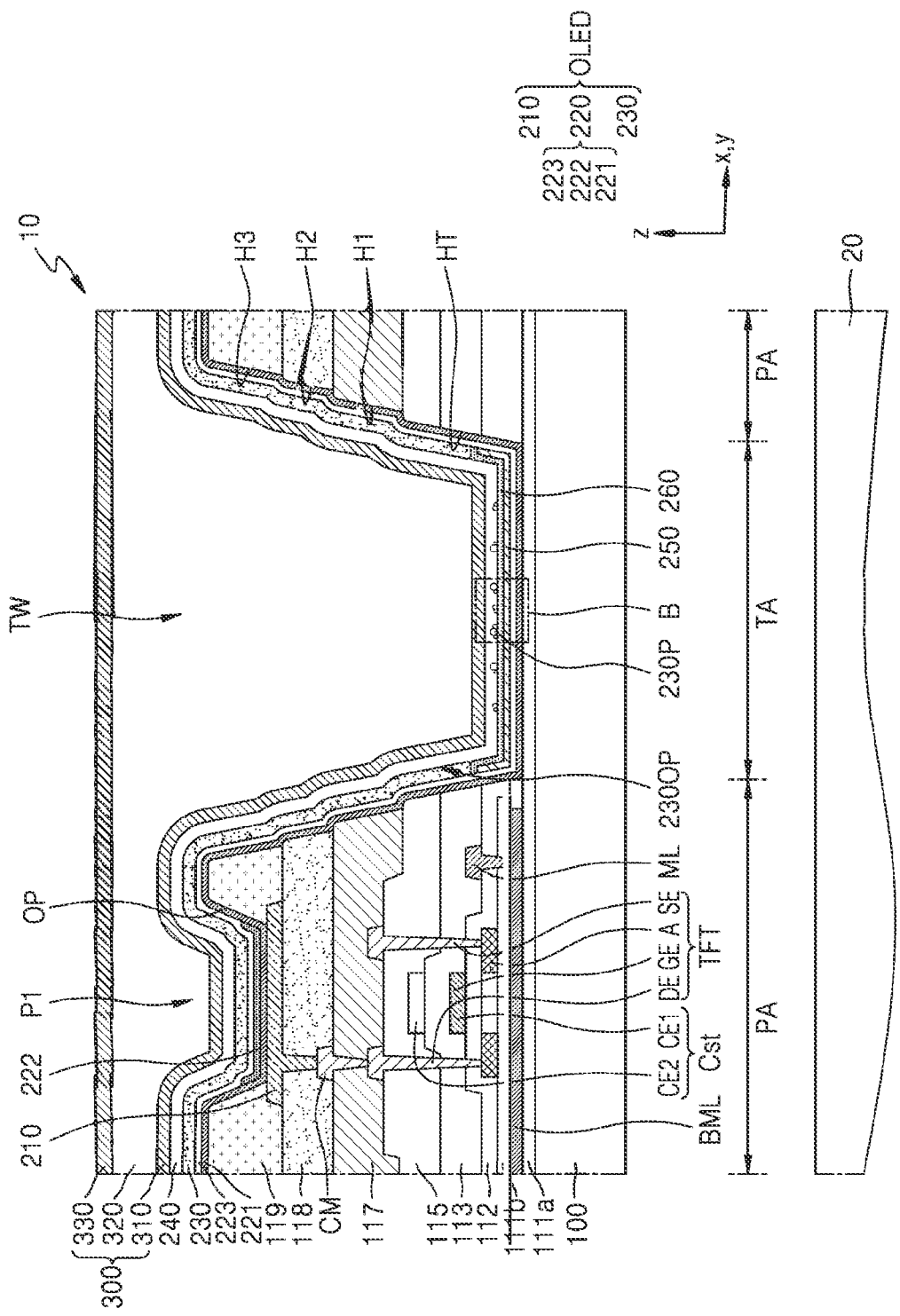
FIG. 4 is a cross-sectional view schematically illustrating a part of a first area of a display device according to an embodiment.
Figure 5:
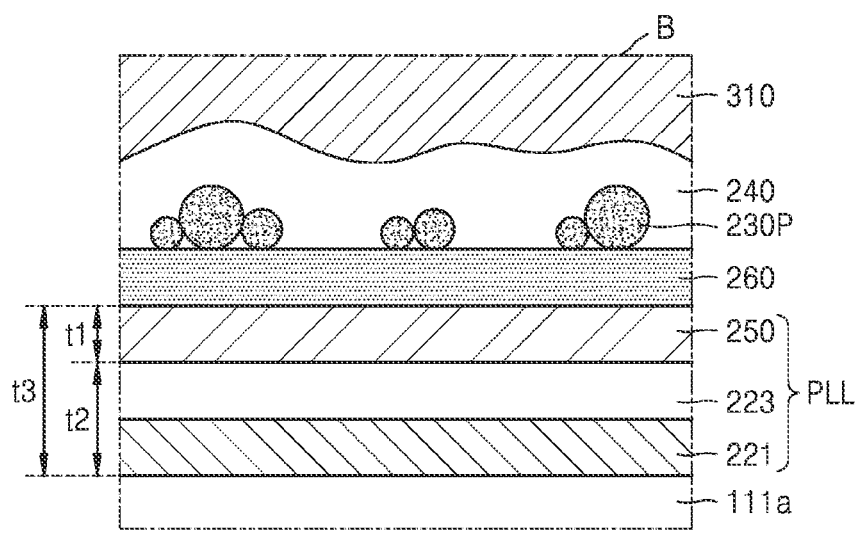
FIG. 5 is an enlarged cross-sectional view of portion B in FIG. 4.
Figure 6:
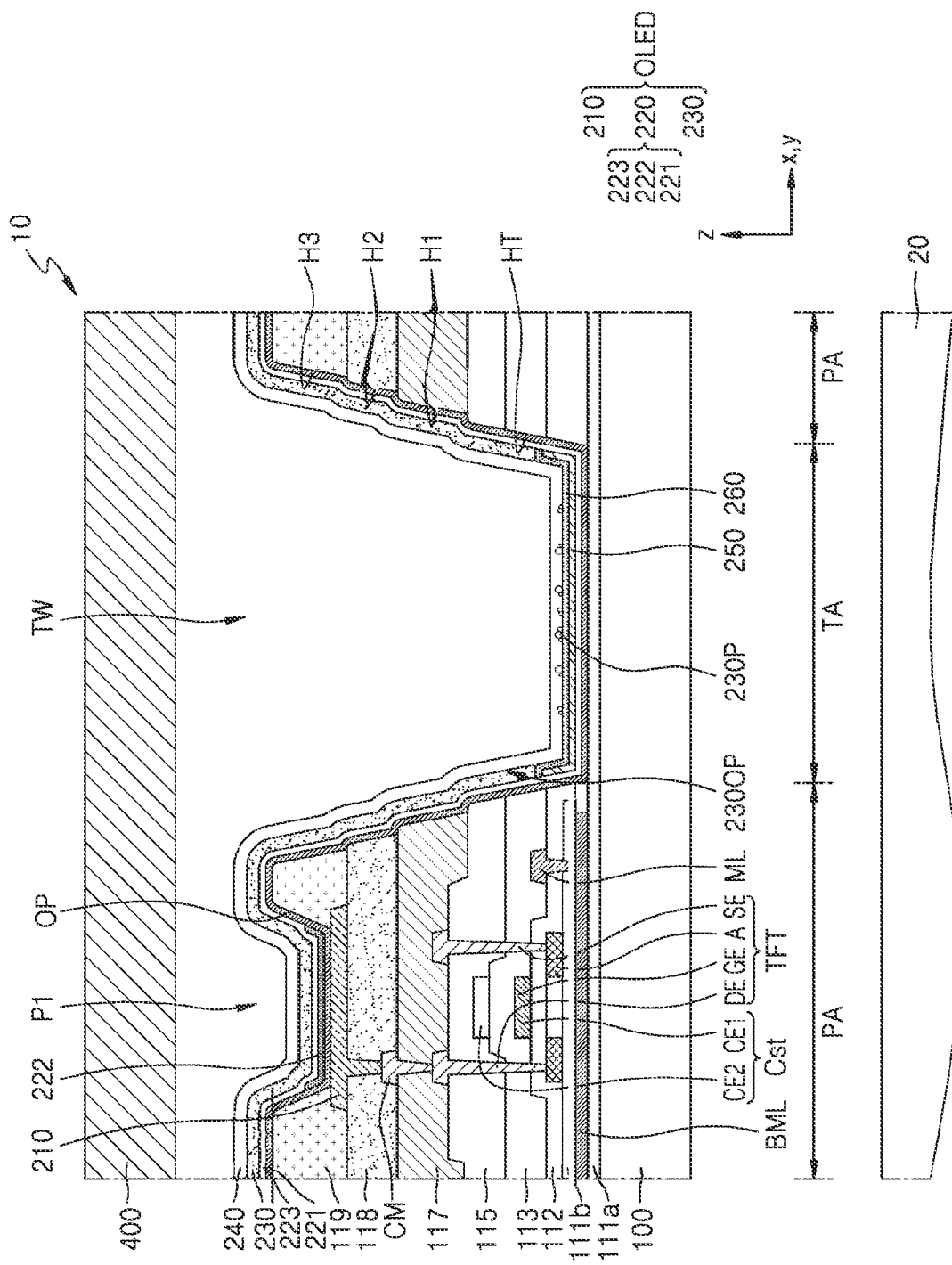
FIG. 6 and FIG. 7 are cross-sectional views each schematically illustrating a part of a first area of a display device according to another embodiment.
Figure 7:
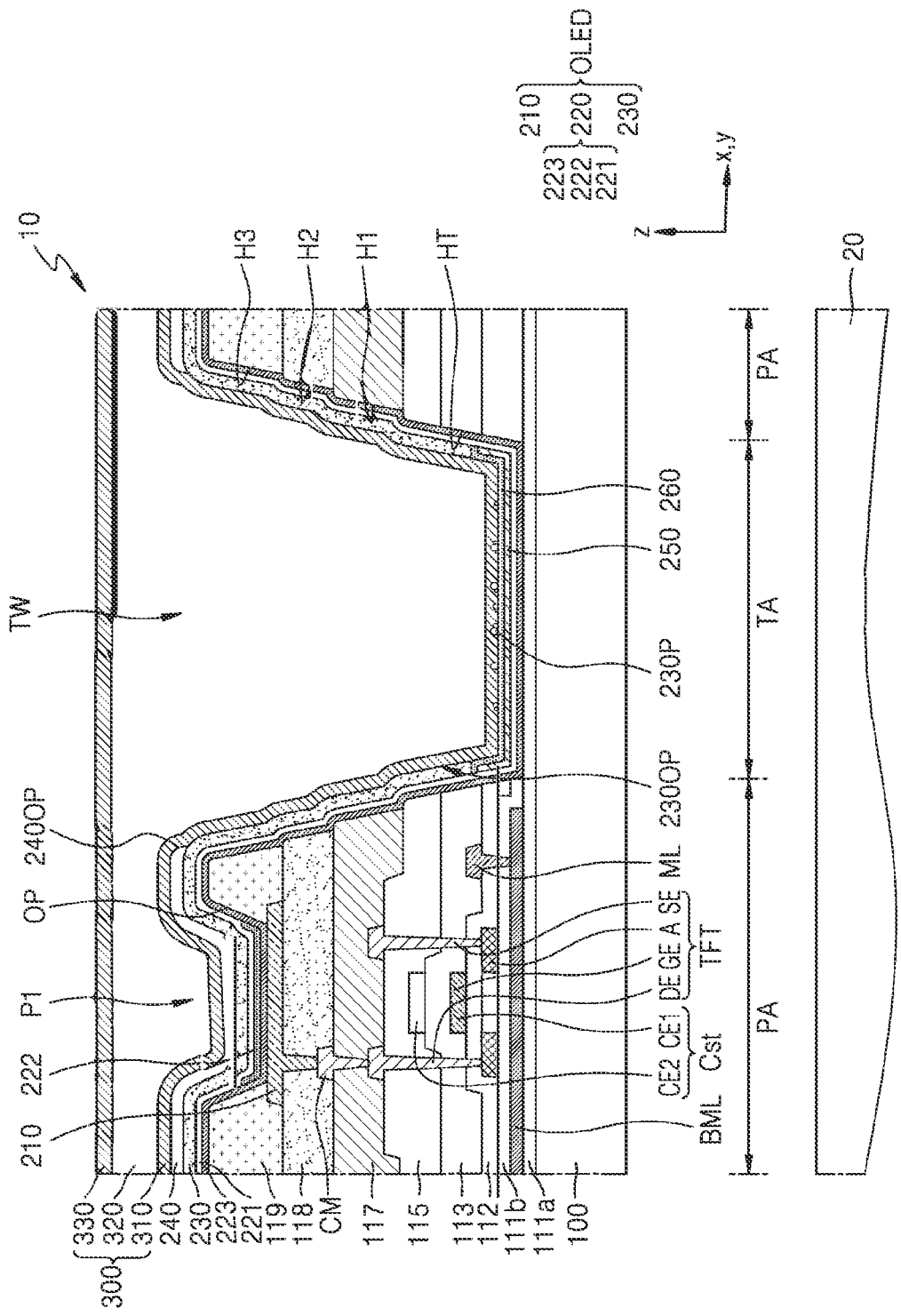

FIG. 4 is a cross-sectional view schematically illustrating a part of a first area of a display device according to an embodiment, and FIG. 5 is an enlarged cross-sectional view of the portion B in FIG. 4. FIGS. 6 and 7 are cross-sectional views each schematically illustrating modified examples of FIG. 4.

Referring to FIG. 4, the substrate 100 may include (e.g., be) a polymer resin. The polymer resin may include (e.g., be), for example, polyethersulfone, polyacrylate, polyetherimide, polyethylene naphthalate, polyethylene terephthalate, polyphenylene sulfide, polyarylate, polyimide, polycarbonate, and/or cellulose acetate propionate. In an embodiment, the substrate 100 may include at least one organic base layer including (e.g., being) an organic material and at least one inorganic base layer including (e.g., being) an inorganic material.

A barrier layer 111a may be arranged on the substrate 100. In an embodiment, as shown in FIG. 4, the barrier layer 111a may be arranged on the entire surface of the first area DA1 over the pixel area PA and the transmission area TA. In another embodiment, the barrier layer 111a is not arranged in the transmission area TA. The barrier layer 111a may reduce or block or reduce the penetration of foreign matter, moisture, and/or external air from the lower portion of the substrate 100, and may provide a flat surface on the substrate 100. The barrier layer 111a may include (e.g., be) an inorganic material such as oxide and/or nitride, or an organic/inorganic composite, and may have a single-layer or multi-layer structure. For example, the barrier layer 111a may include (e.g., be) silicon nitride (SiNx), silicon oxide (SiOx), and/or silicon oxynitride (SiON).

The first pixel P1 may be arranged to correspond to the pixel area PA. Although FIG. 4 illustrates only a laminate structure of the first pixel P1 in the first area DA1, a laminate structure of the second pixel P2 in the second area DA2 may be the same as the laminate structure of the first pixel P1 in the first area DA1. However, in an embodiment, the bottom metal layer BML may not be arranged under the second pixel P2 in the second area DA2.

The pixel area PA may be provided with and/or include insulating layers, a thin-film transistor TFT, a storage capacitor Cst, and an organic light-emitting diode OLED. The transmission area TA may have a transmission hole HT, which is an opening from which some insulating layers are removed to secure transmittance.

The bottom metal layer BML may be arranged under the thin-film transistor TFT of the first pixel P1 to overlap the thin-film transistor TFT. The bottom metal layer BML may be arranged on the barrier layer 111a after the barrier layer 111a is formed on the substrate 100 as shown in FIG. 4, and, in some embodiments, may also be arranged immediately on the substrate 100.

In some embodiments, the bottom metal layer BML arranged to overlap the thin-film transistor TFT may not be provided. In another embodiment, a plurality of bottom metal layers BML may be provided in the first area DA1, and some of the plurality of bottom metal layers BML may be arranged on different layers from each other. The bottom metal layer BML may be arranged under the first pixel P1 to prevent or reduce the thin-film transistor TFT arranged in the first pixel P1 from being damaged and/or deteriorated by the component 20 or to reduce the damage and/or deterioration or the thin-film transistor TFT.

In some embodiments, the bottom metal layer BML may be coupled (e.g., connected) to a conductive layer ML arranged on a different layer through a contact hole. The bottom metal layer BML may receive a constant voltage or a signal from the conductive layer ML. For example, the bottom metal layer BML may receive a driving voltage ELVDD, an initialization voltage Vint, or a scan signal. The bottom metal layer BML may significantly reduce the probability of electrostatic discharge occurring because it receives a constant voltage or a signal. In another embodiment, the bottom metal layer BML may not receive an electric signal at all. In another embodiment, when a plurality of bottom metal layers BML is provided, at least one of the plurality of bottom metal layers BML is electrically isolated, and the others receive an electrical signal. For example, various suitable modifications are possible.

The bottom metal layer (BML) may include (e.g., be) aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and/or copper (Cu). The bottom metal layer BML may have a single-layer structure or a multi-layer structure including (e.g., being) one or more of the above-described materials.

A buffer layer 111b may be arranged on the bottom metal layer BML. A thin-film transistor TFT may be arranged on the buffer layer 111b. The thin-film transistor TFT includes a semiconductor layer A, a gate electrode GE, and a source electrode SE and a drain electrode DE which are electrode layers. The thin-film transistor TFT may be coupled (e.g., connected) to the organic light-emitting diode OLED to drive the organic light-emitting diode OLED.

The semiconductor layer A may be arranged on the buffer layer 111b, and may include (e.g., be) polysilicon. In another embodiment, the semiconductor layer A may include (e.g., be) amorphous silicon. In another embodiment, the semiconductor layer A may include (e.g., be) an oxide of at least one selected from indium (In), gallium (Ga), tin (Sn), zirconium (Zr), vanadium (V), hafnium (Hf), cadmium (Cd), germanium (Ge), chromium (Cr), titanium (Ti), and zinc (Zn). The semiconductor layer A may include a channel region, and a source region and a drain region which are doped with impurities.

The semiconductor layer A may overlap the bottom metal layer BML with the buffer layer 111b interposed therebetween. In an embodiment, the width of the semiconductor layer (A) may be smaller than the width of the bottom metal layer (BML). Accordingly, when projected in a direction normal (e.g., perpendicular) to the substrate 100, the semiconductor layer A may entirely overlap (e.g., be entirely overlapped by) the bottom metal layer BML. In another embodiment, the bottom metal layer BML may be provided to correspond to the pixel area PA, and in this case, the plurality of semiconductor layers A may overlap the bottom metal layer BML.

A first gate insulating layer 112 may be provided to cover the semiconductor layer A. The first gate insulating layer 112 may include (e.g., be) an inorganic insulating material such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and/or zinc oxide ($ZnO_2$). The first gate insulating layer 112 may have a single-layer structure or a multi-layer structure including (e.g., being) one or more of the above-described inorganic insulating materials.

The gate electrode GE is arranged on the first gate insulating layer 112 to overlap the semiconductor layer A. The gate electrode GE may include (e.g., be made of) molybdenum (Mo), aluminum (Al), copper (Cu), titanium (Ti), and/or the like, and may have a single-layer structure or a multi-layer structure. For example, the gate electrode GE may be a single layer including (e.g., being) molybdenum (Mo).

A second gate insulating layer 113 may be provided to cover the gate electrode GE. The second gate insulating layer 113 may include (e.g., be) an inorganic insulating material such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and/or zinc oxide ($ZnO_2$). The second gate insulating layer 113 may have a single-layer structure or a multi-layer structure including (e.g., being) one or more of the above-described inorganic insulating materials.

A second electrode CE2 of the storage capacitor Cst may be arranged on the second gate insulating layer 113. In the pixel circuit PC according to the present embodiment, the second electrode CE2 may overlap the gate electrode GE thereunder. The gate electrode GE and the second electrode CE2, overlapping with the second gate insulating layer 113 interposed therebetween, may constitute the storage capacitor Cst. The gate electrode GE may be a first electrode CE1 of the storage capacitor Cst.

The second electrode CE2 may include (e.g., be) aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and/or copper (Cu), and may have a single-layer structure or a multi-layer structure including (e.g., being) one or more of the above-described inorganic insulating materials.

An interlayer insulating layer 115 may be formed to cover the second electrode CE2. The interlayer insulating layer 115 may include (e.g., be) silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and/or zinc oxide ($ZnO_2$).

In the present embodiment, the buffer layer 111b, the first gate insulating layer 112, the second gate insulating layer 113, and the interlayer insulating layer 115, which are arranged on the barrier layer 111a, are collectively referred to as inorganic insulating layers IL.

The source electrode SE and the drain electrode DE are arranged on the interlayer insulating layer 115. The source electrode SE and the drain electrode DE may include (e.g., be) a conductive material such as molybdenum (Mo), aluminum (Al), copper (Cu), and/or titanium (Ti), and may be formed to have a single-layer structure or a multi-layer structure including (e.g., being) one or more of the above-described materials. For example, the source electrode SE and the drain electrode DE may have a multi-layer structure of Ti/Al/Ti.

A first organic insulating layer 117 may be arranged to cover the source electrode SE and the drain electrode DE. The first organic insulating layer 117 may have a flat top surface such that the pixel electrode 210 arranged thereon is formed flat.

A second organic insulating layer 118 may be arranged on the first organic insulating layer 117. A contact metal CM may be arranged between the first organic insulating layer 117 and the second organic insulating layer 118. The contact metal CM may be configured to electrically couple (e.g., electrically connect) the drain electrode DE to the pixel electrode 210 through contact holes respectively formed in the first organic insulating layer 117 and the second organic insulating layer 118.

The first and second organic insulating layers 117 and 118 may each be formed as a single-layer or multi-layer film made of an organic material and/or an inorganic material. The first and second organic insulating layers 117 and 118 may include (e.g., be) a general-purpose polymer such as benzocyclobutene (BCB), polyimide, hexamethyldisiloxane (HMDSO), polymethylmethacrylate (PMMA), and/or polystyrene (PS), a polymer derivative having a phenol-based group, an acrylic polymer, an imide-based polymer, an aryl ether-based polymer, an amide-based polymer, a fluorine-based polymer, a p-xylene-based polymer, a vinyl alcohol-based polymer, or a blend thereof. In some embodiments, the first and second organic insulating layers 117 and 118 may each include (e.g., be) silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and/or zinc oxide ($ZnO_2$).

An organic light-emitting diode (OLED) may be arranged on the second organic insulating layer 118. The organic light-emitting diode OLED may include a pixel electrode 210, an intermediate layer 220 including an emission layer 222, and a counter electrode 230.

The pixel electrode 210 may include (e.g., be) a conductive oxide such as indium tin oxide (ITO), indium zinc oxide (IZO), zinc oxide (ZnO), indium oxide ($In_2O_3$), indium gallium oxide (IGO), and/or aluminum zinc oxide (AZO). In another embodiment, the pixel electrode 210 may include a reflective layer containing (e.g., being) silver (Ag), magnesium (Mg), aluminum (Al), platinum (Pt), palladium (Pd), gold (Au), nickel (Ni), or neodymium (Nd), iridium (Ir), chromium (Cr), or a compound thereof. In another embodiment, the pixel electrode 210 may further include a layer formed of ITO, IZO, ZnO, and/or $In_2O_3$ on/under the above-described reflective layer. For example, the pixel electrode 210 may have a laminate structure of ITO/Ag/ITO.

The display panel 10 shown in FIG. 4 is a front-emission type or kind, or front-emission configured, display panel 10, but the present disclosure is not limited thereto. The display panel 10 may be a back-emission type or kind, or back-emission configured, display panel. In this case, the pixel electrode 210 may include (e.g., be) a transparent conductive oxide, and may have a transparent or semi-transparent structure.

A third organic insulating layer 119 corresponding to a pixel defining layer may cover the edge of each of the pixel electrodes 210. The third organic insulating layer 119 overlaps each of the pixel electrodes 210, and includes an opening OP defining an emission region of the pixel. The opening OP may be defined as an emission region in the first pixel P1. The third organic insulating layer 119 may serve to prevent, reduce, or suppress arcs and/or the like from occurring at the edge of the pixel electrode 210 by increasing a distance between the edge of the pixel electrode 210 and the counter electrode 230 on the pixel electrode 210. The third organic insulating layer 119 may be made of an organic insulating material such as polyimide, polyamide, acrylic resin, benzocyclobutene, hexamethyldisiloxane (HMDSO), and/or phenol resin, and may be formed by spin coating and/or the like.

The third organic insulating layer 119 may have a third hole H3 corresponding to the transmission area TA. The third hole H3 may partially or entirely overlap the transmission hole HT. As the first to third holes H1, H2, and H3 are formed to correspond to the transmission area TA, the light transmittance of the transmission area TA may be improved. The intermediate layer 220 and the counter electrode 230, which will be described later, may be arranged on the inner walls of the first to third holes H1, H2, and H3.

A first common layer 221 is arranged to cover the third organic insulating layer 119. The first common layer 221 may have a single-layer structure or a multi-layer structure. The first common layer 221 may be a hole transport layer having a single-layer structure. In some embodiments, the first common layer 221 may include a hole injection layer and/or a hole transport layer.

The hole injection layer may serve to facilitate the injection of holes. The hole injection layer may be made of at least one selected from HATCN, CuPc (cupper phthalocyanine), PEDOT (poly(3,4)-ethylenedioxythiophene), PANI (polyaniline), and NPD (N,N-dinaphthyl-N,N'-diphenylbenzidine), but the material thereof is not limited thereto.

The hole transport layer may include (e.g., be) a triphenylamine derivative having high hole mobility and excellent or suitable stability such as TPD(N,N'-diphenyl-N,N'-bis(3-methylphenyl)-1,1'-bi-phenyl-4,4'-diamine) and/or NPB(N,N'-di(naphthalen-1-yl)-N,N'-diphenyl-benzidine) as a host of the hole transport layer, but the present disclosure is not limited thereto.

The emission layer 222 formed to correspond to the pixel electrode 210 is arranged on the first common layer 221. The emission layer 222 may include (e.g., be) a high-molecular material and/or a low-molecular material, and may be to emit red, green, blue, or white light.

A second common layer 223 may be formed on the emission layer 222. The second common layer 223 may have a single-layer structure or a multi-layer structure. The second common layer 223 may include an electron transport layer and/or an electron injection layer. In an embodiment, the electron transport layer may be arranged on the emission layer 222, and the electron injection layer may be arranged on the electron transport layer.

The electron transport layer may serve to facilitate the transport of electrons. The electron transport layer may be made of at least one selected from Alq3 (tris(8-hydroxyquinolino)aluminum), PBD, TAZ, spiro-PBD, BAlq, Liq (lithium quinolate), BMB-3T, PF-6P, TPBI, COT, and SAlq, but the material thereof is not limited thereto.

The electron injection layer may serve to facilitate the injection of electrons. The electron injection layer (EIL) may be made of Yb, Alq3(tris(8-hydroxyquinolino)aluminum), PBD, TAZ, spiro-PBD, BAlq, and/or SAlq, but the material thereof is not limited.

The first common layer 221 and the second common layer 223 may be integrally formed to correspond in common to the pixels P1 and P2 (FIG. 2) included in the first and second areas DA1 and DA2. In another embodiment, the first common layer 221 and/or the second common layer 223 may not be provided.

The counter electrode 230 is arranged on the second common layer 223. The counter electrode 230 may include (e.g., be) a first material having high surface energy. In an embodiment, the counter electrode 230 may include a co-deposition layer containing (e.g., being) silver (Ag), aluminum (Al), magnesium (Mg), or an alloy thereof. For example, the counter electrode 230 may include a co-deposition layer containing (e.g., being) silver (Ag) as a main material, a co-deposition layer containing (e.g., being) aluminum (Al) as a main material, or a co-deposition layer containing (e.g., being) magnesium (Mg) as a main material to control surface energy.

The counter electrode 230 may further contain a conductive material having a low work function. For example, the conductive material having a low work function may be silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), or an alloy thereof. In some embodiments, the counter electrode 230 may further include a layer containing (e.g., being) ITO, IZO, ZnO, and/or $In_2O_3$ on the (semi)transparent layer containing (e.g., being) the above-described material. The counter electrode 230 may be integrally provided on the display area DA.

As described above, the display panel 10 may be a back-emission type or kind, or back-emission configured, display panel. In this case, the counter electrode 230 may include a reflective layer containing (e.g., being) silver (Ag), magnesium (Mg), aluminum (Al), platinum (Pt), palladium (Pd), gold (Au), nickel (Ni), neodymium (Nd), iridium (Ir), chromium (Cr), or a compound thereof. In another embodiment, the counter electrode 230 may further include a layer formed of ITO, IZO, ZnO, and/or $In_2O_3$ on/under the above-described reflective layer.

In some embodiments, according to an embodiment of the present disclosure, the counter electrode 230 is not provided in the transmission area TA. This will be described in more detail later.

A capping layer 240 for improving the extraction rate of light emitted from the organic light-emitting diode OLED may be formed on the counter electrode 230. In an embodiment, the capping layer 240 may have a refractive index of about 1.7 to about 1.99, and may have a thickness of about 300 Å to about 1000 Å. The capping layer 240 may include (e.g., be) a metal material, for example, lithium fluoride (LiF). In some embodiments, the capping layer 240 may include (e.g., be) an inorganic insulating material such as silicon nitride, and/or an organic insulating material. In an embodiment, the capping layer 240 may not be provided.

The organic light-emitting diode OLED may be encapsulated by a thin-film encapsulation layer 300. The thin-film encapsulation layer 300 may be arranged on the counter electrode 230, and may be arranged on the capping layer 240 when the capping layer 240 is formed on the counter electrode 230. The thin-film encapsulation layer 300 may prevent, reduce, or block external moisture and/or foreign substances from penetrating into the organic light-emitting diode OLED.

The thin-film encapsulation layer 300 may include at least one inorganic encapsulation layer and at least one organic encapsulation layer. In this regard, FIG. 4 illustrates a thin-film encapsulation layer 300 having a structure in which a first inorganic encapsulation layer 310, an organic encapsulation layer 320, and a second inorganic encapsulation layer 330 are laminated. In another embodiment, the number of organic encapsulation layers and the number of inorganic encapsulation layers, and a laminating order may be suitably changed.

The first inorganic encapsulation layer 310, the organic encapsulation layer 320, and the second inorganic encapsulation layer 330 may be arranged on the entire surface of the display area DA, and may be integrally formed to cover the first area DA1 and the second area DA2. Accordingly, the first inorganic encapsulation layer 310, the organic encapsulation layer 320, and the second inorganic encapsulation layer 330 may be arranged even in the transmission area TA.

In some embodiments, the organic encapsulation layer 320 is integrally formed to cover the first area DA1 and the second area DA2, but does not exist (or is not provided) in the transmission area TA. For example, the organic encapsulation layer 320 may include an opening corresponding to the transmission area TA. For example, the organic encapsulation layer 320 may include an opening partially or entirely overlapping transmission area TA. In this case, the first inorganic encapsulation layer 310 and the second inorganic encapsulation layer 330 may contact each other inside the transmission hole HT.

In another embodiment, as shown in FIG. 6, the display device 1 according to an embodiment may include not a thin-film encapsulation layer, and may include an encapsulation substrate 400 instead of the thin-film insulation layer as an encapsulation member. The encapsulation substrate 400 may be made of an insulating material such as glass, quartz, and/or polymer resin. The encapsulation substrate 400 may be coupled (e.g., attached) to the substrate 100 through a sealant, for example, a frit, arranged in the peripheral area NDA. Through this structure, it is possible to prevent, reduce, or block external moisture and/or foreign substances from penetrating into the organic light-emitting diode OLED.

In some embodiments, referring to the transmission area TA, a transmission window TW may be provided in the transmission area TA. Light output from the component 20 to the outside and/or light traveling toward the component 20 from the outside may be transmitted through the transmission window TW. The transmission window TW may be implemented by the transmission hole HT and the holes H1, H2 and H3 formed in the inorganic insulating layer IL and the organic insulating layers 117, 118, and 119. For example, the transmission window TW may correspond to a planar area where the transmission hole HT and the holes H1, H2, and H3 overlap in a plan view.

At least a part of the barrier layer 111a may be arranged in the transmission area TA. Because the barrier layer 111a is arranged in the transmission area TA, it is possible to prevent, reduce, or block outgas generated during the manufacturing process of the organic substrate 100 from penetrating into the display layer. In another embodiment, the barrier layer 111a may not be arranged in the transmission area TA. In this case, the transmission hole HT, which will be described later, may extend to the barrier layer 111a, and the substrate 100 may be exposed through the transmission hole HT. For example, the barrier layer 111a may have a hole in the transmission area TA that exposes the substrate 100, and the transmission window TW may correspond to an area in the plan view where the hole in the barrier layer 111a, the transmission hole HT, and the holes H1, H2, and H3 overlap in the plan view.

The inorganic insulating layer IL may have the transmission hole HT that is an opening corresponding to the transmission area TA. As shown in FIG. 4, the transmission hole HT may be formed to expose the barrier layer 111a. The transmission hole HT may be formed by overlapping openings (e.g., openings overlapping in the plan view) of the buffer layer 111b, the first gate insulating layer 112, the second gate insulating layer 113, and the interlayer insulating layer 115, which are formed to correspond to the transmission area TA. The openings may be respectively formed through separate processes or may be simultaneously or concurrently formed through the same process. When the openings are respectively formed by separate processes, a step-shaped surface may be formed inside the transmission hole HT.

The first and second organic insulating layers 117 and 118 may have a first hole H1 and a second hole H2 corresponding to (e.g., at least partially overlapping) the transmission area TA, respectively. The first hole H1 and the second hole H2 may partially or entirely overlap the transmission hole HT. In some embodiments, the third organic insulating layer 119 may have a third hole H3 corresponding to (e.g., at least partially overlapping) the transmission area TA. The third hole H3 may be provided to correspond to the transmission hole HT.

In an embodiment, the width of the third hole H3 along one direction (for example, x direction) may be greater than that of the second hole H2, and the width of the second hole H2 may be greater (e.g., greater in the one direction) than that of the first hole H1, and the width of the first hole H1 may be greater (e.g., greater in the one direction) than the width of the transmission hole HT. However, the present disclosure is not limited thereto. For example, at least one selected from the first to third organic insulating layers 117, 118, and 119 may be formed to cover the inner surface of the transmission hole HT. In this case, the width of at least one selected from the first to third holes H1, H2, and H3 may be smaller than the width of the transmission hole HT.

The emission layer 222 of the intermediate layer 220 is formed only in the pixel area PA to correspond to each pixel (for example, the first pixel), but the first common layer 221 and the second common layer 223 may be arranged even in the transmission area TA. The first common layer 221 and the second common layer 223 may be integrally formed over the entire display area DA.

A photoluminescent layer 250 may be arranged on the second common layer 223 of the transmission area TA. In an embodiment, the photoluminescent layer 250 may be arranged on the electron injection layer EIL of the second common layer 223. In another embodiment, the photoluminescent layer 250 may be arranged on the electron transport layer (ETL).

The photoluminescent layer 250 may include (e.g., be) a photoluminescent material. The photoluminescent layer 250 may include (e.g., be) a material that is excited when external light of a specific wavelength band is applied, and returns to a ground state to emit light. The photoluminescent material may be a material having many conjugated bonding structures. For example, the photoluminescent material may be an aryl amine derivative, an oxadiazole derivative, a triazole derivative, a benzimidazole derivative, an anthracene derivative, a carbazole derivative, or a mixture thereof. In an embodiment, the photoluminescent layer 250 may include (e.g., be) the same material as the intermediate layer 220. For example, the photoluminescent layer 250 may include (e.g., be) the same material as the first common layer 221, the emission layer 222, or the second common layer 223. A thickness t1 of the photoluminescent layer 250 may be about 10 Å to about 1000 Å.

An auxiliary layer 260 may be arranged on the photoluminescent layer 250. When the counter electrode 230 includes (e.g., is) a first material, the auxiliary layer 260 includes (e.g., is) a second material having lower surface energy than the first material at room temperature. For example, the first material and the second material satisfy Equation 1.

$$ST1-ST2>0 \text{ mJ/m}^2 \qquad \text{Equation 1}$$

Here, ST1 is surface energy of the first material at room temperature, e.g., 25° C., and ST2 is surface energy of the second material at room temperature, e.g., 25° C.

In an embodiment, ST1−ST2 may be 30 mJ/m² or more. In another embodiment, ST1−ST2 may be 50 mJ/m² or more. In some embodiments, ST2 may be more than 0 mJ/m² and 30 mJ/m² or less. For example, ST2 may be 20 mJ/ m² or less, but is not limited thereto.

The second material may contain 30 at % or more of fluorine. The content (e.g., amount) of fluorine in the first material may be obtained by analyzing the first material utilizing X-ray photoelectron spectroscopy (XPS). In one embodiment, the first material may contain 50 at % or more of fluorine, but the content (e.g., amount) of fluorine is not limited thereto.

The second material may include (e.g., be) a fluorine-containing silane compound, a fluorine-based polymer compound, a fluorine-based monomolecular organic compound, and/or combinations thereof. In an embodiment, the second material may include (e.g., be) a fluoro functional group and/or an alkylfluoro functional group.

Examples of the fluorine-containing silane compound may include, but are not limited to, trichloro(1H,1H,2H,2H-perfluorodecyl)silane. trichloro(1H,1H,2H,2H-perfluoro-n-octyl)silane, triethoxy-1H,1H,2H,2H-perfluorodecylsilane, 1H,1H,2H,2H-nonafluorohexyltriethoxysilane, 1H,1H,2H, 2H-tridecafluoro-n-octyltriethoxysilane, 1H,1H,2H,2H-heptadecafluorodecyltrimethoxysilane, 1H,1H,2H,2H-nonafluorohexyltrimethoxysilane, trimethoxy(1H,1H,2H,2H-perfluoro-n-octyl)silane, 1,1,1-rrifluoro-3-(trimethoxysilyl) propane, triethylsilyl)trifluoromethane, triethoxy[5,5,6,6,7, 7,7-heptafluoro-4,4-bis(trifluoromethyl)heptyl]silane, trichloro(3,3,3-trifluoropropyl)silane, dimethoxy(methyl)(3, 3,3-trifluoropropyl)silane, and dichloro(methyl)(3,3,3-trifluoropropyl)silane.

Examples of the fluorine-based polymer compound may include, but are not limited to, poly(hexafluoropropyleneoxide), poly(tetrafluoroethylene-co-hexafluoropropylene), poly(decafluorooctyl acrylate, poly(tetrafluoro-3-(heptafluoropropoxy)propyl acrylate, poly(tetrafluoro-3-(heptafluoroethoxy)propyl acrylate, poly(tetrafluoroetylene), tetrafluoroethylene hexafluoropropylene vinylidene fluoride, poly(undecafluorohexyl acrylate), poly(nonafluoropentyl acrylate), poly(tetrafluoro-3-(trifluoromethoxy)propyl acrylate, poly(pentafluorovinyl propionate, poly(heptafluorobutyl acrylate), poly(trifluorovinyl acetate), poly(1,1,1,3, 3,3-hexafluoroisopropyl acrylate), poly(octafluoropentyl acrylate), poly(methyl 3,3,3-trifluoropropyl siloxane, poly (2,2,3,3,4,4,4-heptafluorobutyl methacrylate), poly(pentafluoropropyl acrylate), poly(2,2,3,3,3-pentafluoropropyl acrylate), poly(2-heptafluorobutoxy)ethyl acrylate, poly (chlorotrifluoroethylene), and poly(1,1,1,3,3,3-hexafluoroisopropyl methaacrylate).

The fluorine-based monomolecular organic compound is an organic compound having a relatively low surface energy compared to the first material, and as described above, may be a monomolecular organic compound substituted with fluorine to contain an excess of fluorine. In an embodiment, the fluorine-based monomolecular organic compound may be a fluorine-substituted material such that at least one of the materials forming the first common layer 221 or the second common layer 223 contains an excess of fluorine. However, the present disclosure is not limited thereto.

During the manufacturing process, the first material may be integrally deposited on the entire surface of the display area DA including the pixel area PA and the transmission area TA. In this case, because the surface energy of the first material and the surface energy of the second material is controlled or selected to be different from each other, the first material may not selectively form a layer on the upper surface of the auxiliary layer 260 on which the second material is arranged. Accordingly, because the auxiliary layer 260 is arranged to correspond to the transmission area TA, the counter electrode 230 including (e.g., being) the first material may have an opening 230OP corresponding to the transmission area TA. For example, the opening 230OP may correspond to (e.g., overlap in the plan view) the auxiliary layer 260. In some embodiments, the counter electrode 230 may be around (e.g., surround) the auxiliary layer 260. In some embodiments, an edge or side of the counter electrode 230 that at least partially forms the opening 230OP may correspond to (e.g., overlap in the plan view with and/or contact) the auxiliary layer 260 (e.g., an edge or side of the auxiliary layer 260).

A plurality of fine particles 230P may be arranged on the auxiliary layer 260. The plurality of fine particles 230P may include (e.g., be) the first material in substantially the same manner as the counter electrode 230. As described above, due to a difference in surface energy between the first material and the second material, the first material deposited on the auxiliary layer 260 has very low spreadability on the auxiliary layer 260, and thus the plurality of fine particles 230P may be formed by the agglomeration of the first material in the form of particles without forming a layer.

Referring to FIG. 5, the plurality of fine particles 230P may be spaced apart from each other on the auxiliary layer 260, and some of them may be provided in contact with each other. For example, the plurality of fine particles 230P may include a plurality of groups of fine particles, wherein the fine particles in each group are in contact (e.g., directly in contact or indirectly in contact through one or more other fine particles in the group) with the other fine particles in the group, and the groups of fine particles are spaced apart from each other in a plan view. In an embodiment, the diameter of the plurality of fine particles 230P may be smaller than the thickness of the counter electrode 230.

The plurality of fine particles 230P are not provided on the entire surface of the auxiliary layer 260, and are present on a part of the surface thereof and not present on another part of the surface thereof. Through this structure, the counter electrode 230 does not exist in the transmission area TA, so that the transmittance of the transmission area TA may be remarkably improved.

The auxiliary layer 260 may be formed utilizing a fine metal mask. As the resolution of the display device 1 increases, it is useful or desirable to correct the position of the fine metal mask so that the auxiliary layer 260 may be more precisely arranged to correspond to the transmission area TA. This position correction is performed by applying light to the corresponding position on the substrate 100 to confirm photoluminescence. In this case, the second material constituting the auxiliary layer 260 may have no conjugated bonding structure for photoluminescence or the number of conjugated bonding structures may be small. Accordingly, the position of the fine metal mask may be precisely corrected by previously forming the photoluminescent layer 250 under the auxiliary layer 260

In an embodiment, as described above, the first common layer 221 and the second common layer 223 may be integrally formed over the entire display area DA including the pixel area PA and the transmission area TA. The first common layer 221 and/or the second common layer 223 may include (e.g., be) a photoluminescent material. The first common layer 221 and/or the second common layer 223 may form an organic laminate structure PLL, which emits light when irradiated with light, together with the photoluminescent layer 250.

The organic laminate structure PLL may include a first portion corresponding to the transmission area TA and a second portion around (e.g., surrounding) the periphery of the first portion. In this case, because the thickness t3 of the first portion is equal to the sum of the thickness t2 of the first common layer 221 and the second common layer 223 and the thickness t1 of the photoluminescent layer 250, the thickness t3 of the first portion may be greater than the thickness of the second portion equal to the thickness t2 of the first common layer 221 and the second common layer 223. Therefore, when applying external light, the position correction of the fine metal mask may be precisely performed by utilizing a difference in photoluminescence characteristics in accordance with a difference in thickness of the organic laminate structure PLL.

A capping layer 240 may be arranged on the plurality of fine particles 230P in the transmission area TA. FIG. 4 illustrates that the capping layer 240 is arranged even on the transmission area TA to be provided on the entire surface of the display area DA, but the present disclosure is not limited thereto. When the capping layer 240 is arranged in the transmission area TA, at least a part of the capping layer 240 may contact the auxiliary layer 260. The plurality of fine particles 230P may be arranged to be spaced apart from each other in some areas, and the capping layer 240 may contact the auxiliary layer 260 in an area between the plurality of fine particles 230P spaced apart from each other.

In another embodiment, as shown in FIG. 7, the capping layer 240 may be patterned to have an opening 240OP corresponding to (e.g., overlapping in the plan view) the transmission area TA. Like the counter electrode 230, when the capping layer 240 is arranged in the transmission area TA, the transmittance of the transmission area TA may be deteriorated. Accordingly, the capping layer 240 may be patterned to have the opening 240OP corresponding to the transmission area TA, thereby improving the transmittance of the transmission area TA. In an embodiment, the opening 240OP of the capping layer 240 may be formed utilizing a shadow mask.

Although it is shown in FIG. 7 that the end portion of the capping layer 240, forming the opening 240OP, is located on the third organic insulating layer 119, the present disclosure is not limited thereto. The width of the opening 240OP of the capping layer 240 in one direction (for example, the x-direction) may be equal to or greater than the width of the transmission area TA.

The thin-film encapsulation layer 300 may be arranged on the capping layer 240, and as described above, the thin-film encapsulation layer 300 may also be arranged on the transmission area TA.

FIGS. 8 to 11 are cross-sectional views schematically illustrating a method of manufacturing a display device according to an embodiment.

Figure 8:
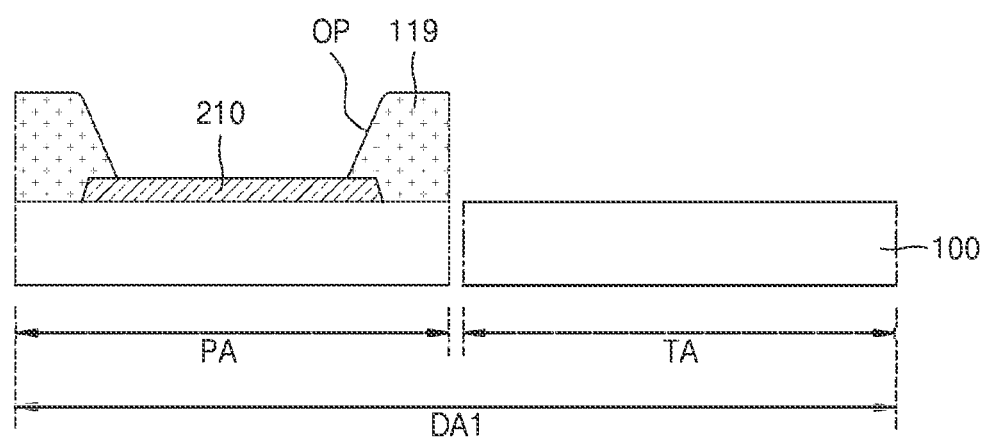
FIGS. 8-11 are cross-sectional views schematically illustrating a method of manufacturing a display device according to an embodiment.

Referring to FIG. 8, after a pixel electrode 210 is formed on a pixel area PA, a third organic insulating layer 119 covering an edge of the pixel electrode 210 and having an opening exposing a central portion of the pixel electrode 210 is formed. The pixel electrode 210 and the third organic insulating layer 119 may not be formed in a transmission area TA. Hereinafter, for convenience of explanation, although it is shown in FIGS. 8 to 11 that the pixel electrode 210 is formed directly on a substrate 100, it may be understood that one or more suitable devices and/or layers, including thin-film transistors, wirings, and insulating layers may be formed on the substrate 100 as shown in FIG. 4, and then the pixel electrode 210 is formed thereon.

Figure 9:
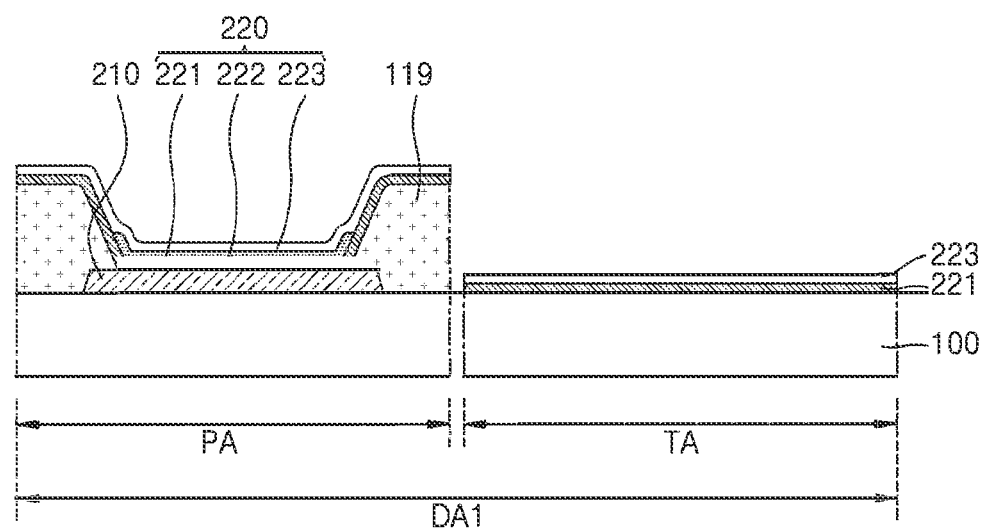

Then, as shown in FIG. 9, an intermediate layer 220 may be formed on the pixel electrode 210. In more detail, a first common layer 221 is formed on the pixel electrode 210, an emission layer 222 is formed on the first common layer 221, and a second common layer 223 may be formed on the emission layer 222. The emission layer 222 is patterned for each pixel and may be formed only on the pixel electrode 210, whereas the first and second common layers 221 and 223 are formed in the transmission area TA as well as the pixel area PA.

Figure 10:
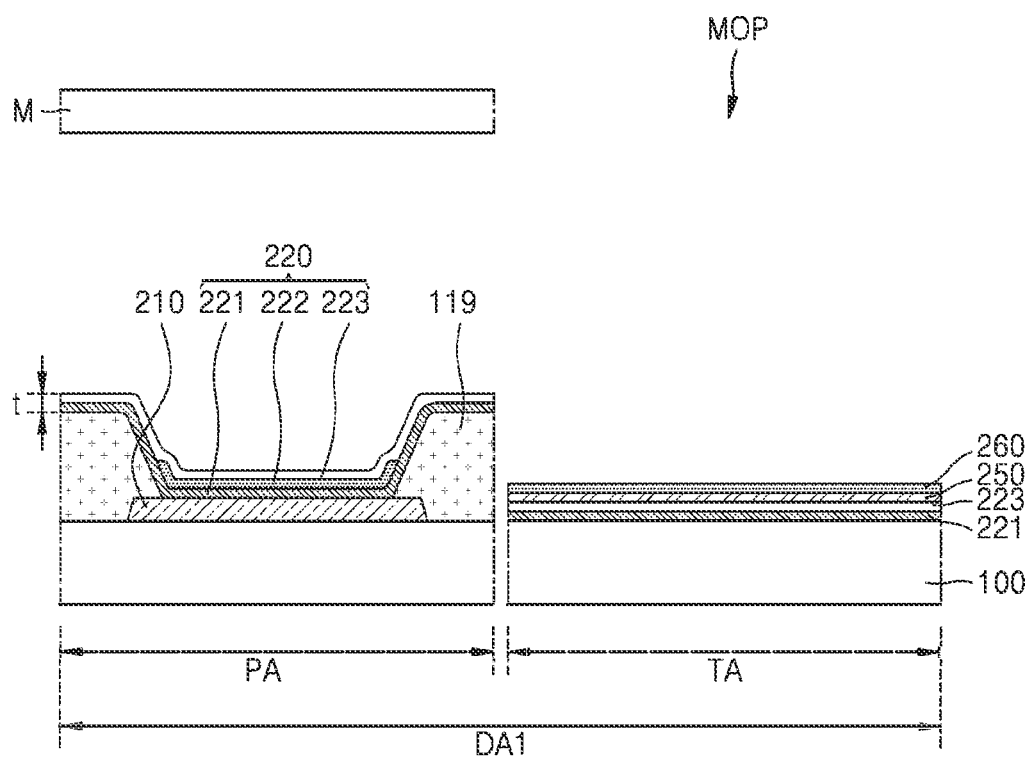

Then, as shown in FIG. 10, a photoluminescent layer 250 and an auxiliary layer 260 may be sequentially formed in the transmission area TA. The photoluminescent layer 250 may include (e.g., be) a photoluminescent material, and basic properties of the photoluminescent material and the photoluminescent layer 250 may each independently be the same as those described above. The auxiliary layer 260 may include (e.g., be) a second material having lower surface energy than a first material included in a counter electrode 230. The second material may contain 30 at % or more of fluorine, and basic properties of the second material and the auxiliary layer 260 may each independently be the same as those described above.

The photoluminescent layer 250 and the auxiliary layer 260 may be formed utilizing the same fine metal mask M, and may be sequentially formed in substantially the same deposition chamber. The photoluminescent layer 250 may include (e.g., be) a photoluminescent material having more conjugated structures than the second material included in the auxiliary layer 260. In an embodiment, the photoluminescent layer 250 and the auxiliary layer 260 may be sequentially formed utilizing a fine metal mask M having a mask opening MOP corresponding to the transmission area TA, the photoluminescent layer 250 may be irradiated with light, and the position of the fine metal mask M may be corrected based on the emission pattern of the photoluminescent layer 250. Therefore, even in the display device 1 having a high resolution of 500 ppi or more, an offset between the substrate 100 and the fine metal mask M during the deposition process may be more accurately corrected.

Figure 11:
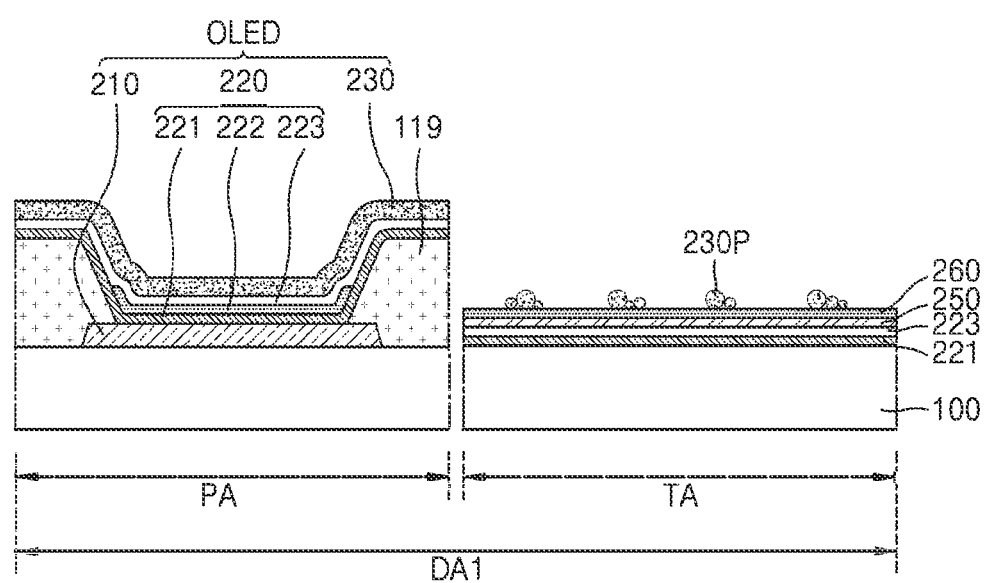

Then, as shown in FIG. 11, the first material may be deposited on the entire surface of the pixel area PA and the transmission area TA. In order to control the intensity of the surface energy of the first material, a conductive material having high surface energy may be co-deposited. For example, the first material may be co-deposited with another conductive material such that silver (Ag), aluminum (Al), or magnesium (Mg) is a main material. The first material deposited in the pixel area PA may form a counter electrode 230. On the other hand, the first material deposited in the transmission area TA may form a plurality of fine particles 230P. For example, the first material in the pixel area PA is formed into a layer having the same thickness as the counter electrode 230 on the second common layer 223, whereas the first material in the transmission area TA is not formed into a layer (e.g., a continuous layer over the transmission area TA) on the auxiliary layer 260, but is formed into a plurality of fine particles 230P including (e.g., being) the same material as the counter electrode 230 on the auxiliary layer 260.

Because the auxiliary layer 260 according to the present embodiment includes (e.g., is) the second material having lower surface energy than the first material at room temperature, when the first material having high surface energy is deposited on the upper surface of the auxiliary layer 260, the first material has poor spreadability, and thus a normal layer is not formed. Accordingly, on the auxiliary layer 260, the first material is aggregated in the form of particles to form a plurality of fine particles 240P.

As described above, in the display device 1 according to an embodiment, the auxiliary layer 260 is provided in the transmission area TA so that the counter electrode 230 is selectively formed only in the pixel area PA. Accordingly, it is possible to prevent the counter electrode 230 from being formed in the transmission area TA without the patterning process of the counter electrode 230, thereby remarkably improving the transmittance of the transmission area TA.

As used herein, the term "substantially," "about," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Also, any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

The display device and/or any other relevant devices or components according to embodiments of the present invention described herein may be implemented utilizing any suitable hardware, firmware (e.g. an application-specific integrated circuit), software, or a combination of software, firmware, and hardware. For example, the various components of the device may be formed on one integrated circuit (IC) chip or on separate IC chips. Further, the various components of the [device] may be implemented on a flexible printed circuit film, a tape carrier package (TCP), a printed circuit board (PCB), or formed on one substrate. Further, the various components of the device may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the scope of the exemplary embodiments of the present invention.

As described above, according to an embodiment, it is possible to implement a display device including a transmission area having improved transmittance. However, the scope of the present disclosure is not limited by these effects.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the drawings, it will be understood by those of ordinary skill in the art that one or more suitable changes in form and details may be made therein without departing from the spirit and scope as defined by the following claims and equivalents thereof.

What is claimed is:

1. A display device comprising:
    a substrate comprising a display area and a peripheral area outside the display area, the display area having a transmission area and a pixel area;
    a display element corresponding to the pixel area and comprising a pixel electrode, an intermediate layer on the pixel electrode, and a counter electrode on the intermediate layer;
    a photoluminescent layer corresponding to the transmission area and comprising a photoluminescent material; and
    an auxiliary layer on the photoluminescent layer,
    wherein the counter electrode comprises a first material, the auxiliary layer comprises a second material, and the first material is higher in surface energy than the second material, at 25° C.

2. The display device of claim 1, wherein the first material comprises silver (Ag), aluminum (Al), magnesium (Mg), or an alloy thereof.

3. The display device of claim 2, wherein the second material comprises a fluorine-containing silane compound, a fluorine-based polymer compound, a fluorine-based monomolecular organic compound, or any combination thereof.

4. The display device of claim 1, wherein the second material contains at least 30 at % of fluorine.

5. The display device of claim 1, wherein the auxiliary layer overlaps the photoluminescent layer.

6. The display device of claim 1, wherein the photoluminescent material has more conjugated bonding structures than the second material.

7. The display device of claim 1, wherein the photoluminescent material is an aryl amine derivative, an oxadiazole derivative, a triazole derivative, a benzimidazole derivative, an anthracene derivative, a carbazole derivative, or a mixture thereof.

8. The display device of claim 1, wherein the intermediate layer comprises:
    an emission layer corresponding to the pixel electrode; and
    a common layer between the pixel electrode and the counter electrode,
    wherein the photoluminescent layer is on the common layer.

9. The display device of claim 8, wherein the photoluminescent layer comprises a same material as the common layer or the emission layer comprises.

10. The display device of claim 9, further comprising:
    an organic laminate structure under the auxiliary layer and comprising the photoluminescent material, wherein the organic laminate structure has a first portion corresponding to the transmission area and a second portion around a periphery of the first portion,
    wherein the first portion is thicker than the second portion.

11. The display device of claim 1, wherein the photoluminescent layer has a thickness of about 10 Å to about 1000 Å.

12. The display device of claim 1, further comprising a capping layer arranged on the counter electrode to correspond to the display area.

13. The display device of claim 12, wherein the capping layer has an opening corresponding to the transmission area.

14. The display device of claim 1, wherein the counter electrode has an opening corresponding to the transmission area.

15. The display device of claim 14, further comprising a plurality of fine particles on the auxiliary layer and comprising the first material.

16. A method of manufacturing a display device, the method comprising:
  providing a substrate, the substrate comprising a display area and a peripheral area outside the display area, the display area having a transmission area and a pixel area;
  forming a pixel electrode to correspond to the pixel area;
  forming an intermediate layer on the pixel electrode to correspond to the pixel area and the transmission area;
  sequentially forming a photoluminescent layer and an auxiliary layer to correspond to the transmission area; and
  depositing a first material on the intermediate layer and the auxiliary layer to correspond to the pixel area and the transmission area,
  wherein the auxiliary layer comprises a second material, and
  the first material is higher in surface energy than the second material, at 25° C.

17. The method of claim 16, wherein the sequential forming of the photoluminescent layer and the auxiliary layer comprises:
  forming the photoluminescent layer and the auxiliary layer utilizing a fine metal mask;
  irradiating the photoluminescent layer with light; and
  correcting a position of the fine metal mask based on an emission pattern of the photoluminescent layer.

18. The method of claim 17, wherein the photoluminescent layer comprises a photoluminescent material, and
  the photoluminescent material has more conjugated bonding structures than the second material.

19. The method of claim 16, wherein the depositing of the first material comprises:
  forming a counter electrode on the intermediate layer to correspond to the pixel area; and
  forming a plurality of fine particles on the auxiliary layer to correspond to the transmission area.

20. The method of claim 19, wherein the forming of the counter electrode and the forming of the plurality of fine particles are performed concurrently.

* * * * *